(12) United States Patent
Horng et al.

(10) Patent No.: US 7,031,157 B2
(45) Date of Patent: Apr. 18, 2006

(54) HEAT-DISSIPATING MODULE

(75) Inventors: Alex Horng, Kaohsiung (TW);
Yin-Rong Hong, Kaohsiung (TW);
Ching-Sheng Hong, Kaohsiung (TW)

(73) Assignee: Sunonwealth Electric Machine Industry Co., Ltd., Kaohsiung (TW)

( * ) Notice: Subject to any disclaimer, the term of this patent is extended or adjusted under 35 U.S.C. 154(b) by 259 days.

(21) Appl. No.: 10/653,079

(22) Filed: Sep. 3, 2003

(65) Prior Publication Data

US 2005/0024829 A1 Feb. 3, 2005

(51) Int. Cl.
*H05K 7/20* (2006.01)

(52) U.S. Cl. ............... 361/695; 361/697; 415/68; 415/220; 415/208.2

(58) Field of Classification Search ........ 361/685, 361/687, 695–696, 697, 715–719; 165/120–126, 165/80.3; 454/184; 415/213.1, 214.1, 220, 415/221, 177, 178, 60–61, 66–69, 47–50; 416/39, 120, 128–129, 198 R, 201 A, 247 R
See application file for complete search history.

(56) References Cited

U.S. PATENT DOCUMENTS

| | | | | |
|---|---|---|---|---|
| 2,981,464 A | * | 4/1961 | Omohundro | 415/68 |
| 3,768,546 A | * | 10/1973 | Shipes | 165/96 |
| 6,183,196 B1 | * | 2/2001 | Fujinaka | 415/208.5 |
| 6,293,753 B1 | * | 9/2001 | Pal et al. | 415/221 |
| 6,343,014 B1 | * | 1/2002 | Lin | 361/697 |
| 6,537,019 B1 | * | 3/2003 | Dent | 415/61 |
| 6,611,427 B1 | * | 8/2003 | Liao | 361/695 |
| 6,663,342 B1 | * | 12/2003 | Huang et al. | 415/121.2 |
| 6,796,768 B1 | * | 9/2004 | Fujinaka et al. | 415/208.5 |
| 6,799,942 B1 | * | 10/2004 | Tzeng et al. | 415/61 |
| 6,827,549 B1 | * | 12/2004 | Horng et al. | 415/68 |
| 2003/0026691 A1 | * | 2/2003 | Huang et al. | 415/121.2 |
| 2004/0033135 A1 | * | 2/2004 | Chang | 415/220 |

\* cited by examiner

*Primary Examiner*—Michael Datskovskiy
(74) *Attorney, Agent, or Firm*—Bacon & Thomas, PLLC

(57) ABSTRACT

A heat-dissipating module includes a first fan unit and a second fan unit, which are serially connected together to provide an air inlet and an air outlet. Each of the first fan unit and the second fan unit includes a casing and an impeller. At least one side air inlet is defined in at least one of a plurality of sides of the casing of the first fan unit and a plurality of sides of the casing of the second fan unit. The air inlet amount and the air outlet amount of the second fan unit are increased by the side air inlet. The air density distribution is uniform, and the wind noise during operation is lowered.

9 Claims, 8 Drawing Sheets

HEAT-DISSIPATING MODULE

BACKGROUND OF THE INVENTION

1. Field of the Invention

The present invention relates to a heat-dissipating module. In particular, the present invention relates to a heat-dissipating module including a plurality of serially connected heat-dissipating fan units.

2. Description of Related Art

FIG. 1 is an exploded perspective view of a conventional heat-dissipating module. FIG. 2 is a perspective view of the conventional heat-dissipating module. The heat-dissipating module includes a first fan unit 10 and a second fan unit 20, which are serially connected together to provide an air inlet and an air outlet. The first fan unit 10 is located on the air inlet side, and the second fan unit 20 is located on the air outlet side. Generally, the casing 100 of the first fan unit 10 includes a plurality of engaging notches or grooves 11 and the casing 200 of the second fan unit 20 includes a plurality of engaging tabs 21 for engaging with the engaging grooves 11, thereby serially connecting the first fan unit 10 and the second fan unit 20 together. Thus, an impeller (not shown) of the first fan unit 10 and an impeller 22 of the second fan unit 20 simultaneously drive air, thereby rapidly blowing the air from the air inlet side to the air outlet side.

Although the amount of blown air and the velocity of the air are increased through the use of the above-mentioned heat-dissipating module, several problems still exist. Firstly, cool air can only be sucked into the heat-dissipating module via a single air inlet of the first fan unit 10 on the air inlet side under normal operation of the first fan unit 10 and the second fan unit 20. The overall air output amount is limited. Second, when the first fan unit 10 operates abnormally, the speed of the impeller of the first fan unit 10 is lowered and thus adversely affects the air-blowing efficiency of the impeller 22 of the second fan unit 20 and the overall heat-dissipating efficiency. Third, when the first fan unit 10 or the second fan unit 20 operates abnormally, the air density distribution is not uniform since the air velocity at the impeller of the first fan unit 10 is different from that at the impeller 22 of the second fan unit 20, resulting in poor static pressure-flow rate characteristics and poor P-Q characteristics and generating wind noise.

OBJECTS OF THE INVENTION

An object of the present invention is to provide a heat-dissipating module for increasing the overall air inlet amount and the overall air outlet amount, thereby improving the overall heat-dissipating efficiency.

Another object of the present invention is to provide a heat-dissipating module for avoiding non-uniform air density distribution in the heat-dissipating module and lowering the wind noise generated during operation of the heat-dissipating module when the first fan unit operates abnormally. The overall heat-dissipating efficiency is thus improved.

SUMMARY OF THE INVENTION

To achieve the aforementioned objects, the present invention provides a heat-dissipating module including a first fan unit and a second fan unit, which are serially connected together to provide an air inlet and an air outlet. Each of the first fan unit and the second fan unit includes a casing and an impeller. At least one side air inlet is defined in at least one of a plurality of sides of the casing of the first fan unit and a plurality of sides of the casing of the second fan unit.

The air inlet amount and the air outlet amount of the second fan unit are increased when the first fan unit operates normally. In a case that the impeller of the first fan unit operates abnormally and thus results in a low air-blowing efficiency, the impeller of the second fan unit compensates the shortage of air inlet amount resulting in abnormal operation of the impeller of the first fan unit by introducing air into the heat-dissipating module via the side air inlet. The air density distribution is uniform, and the wind noise during operation is lowered.

Other objects, advantages and novel features of this invention will become more apparent from the following detailed description when taken in conjunction with the accompanying drawings.

DETAILED DESCRIPTION OF THE PREFERRED EMBODIMENTS

Figure 1:
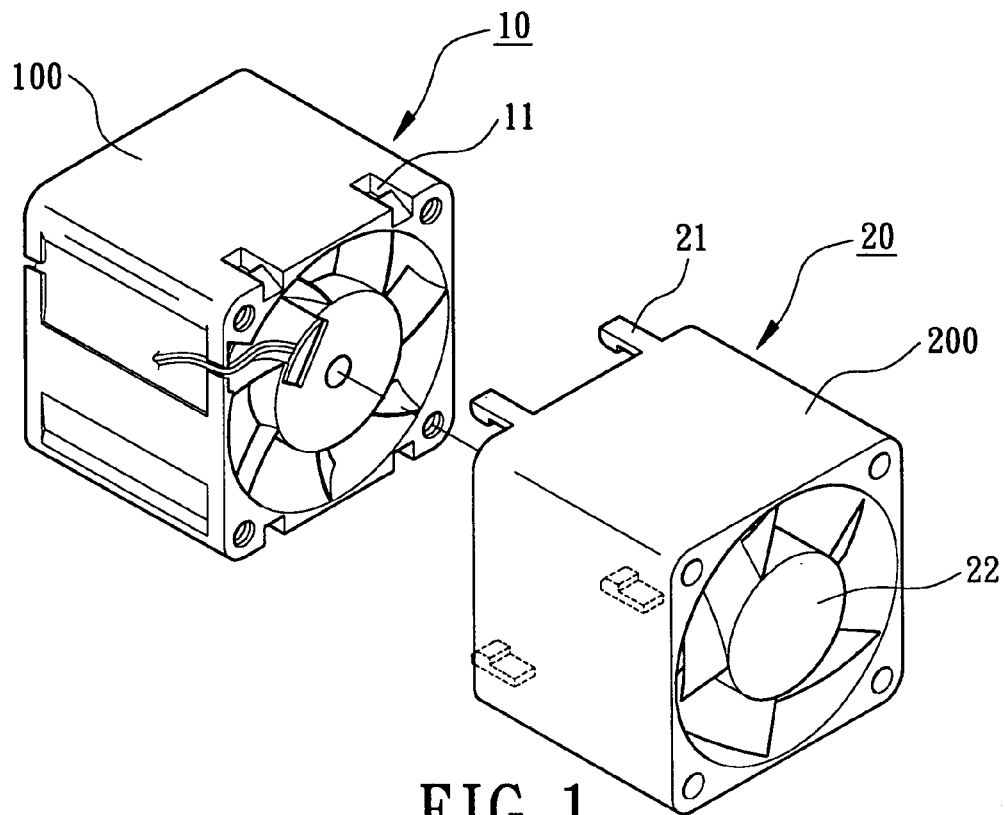
FIG. 1 is an exploded perspective view of a conventional heat-dissipating module.
Figure 2:
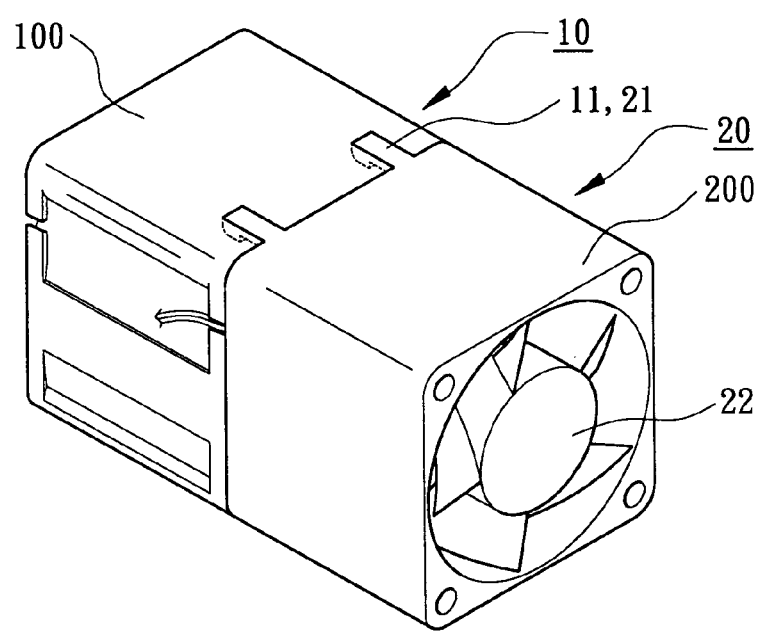
FIG. 2 is a perspective view of the conventional heat-dissipating module.

Preferred embodiments of the present invention are now to be described hereinafter in detail, in which the same reference numerals are used in the preferred embodiments for the same parts as those in the prior art to avoid redundant description.

Figure 3:
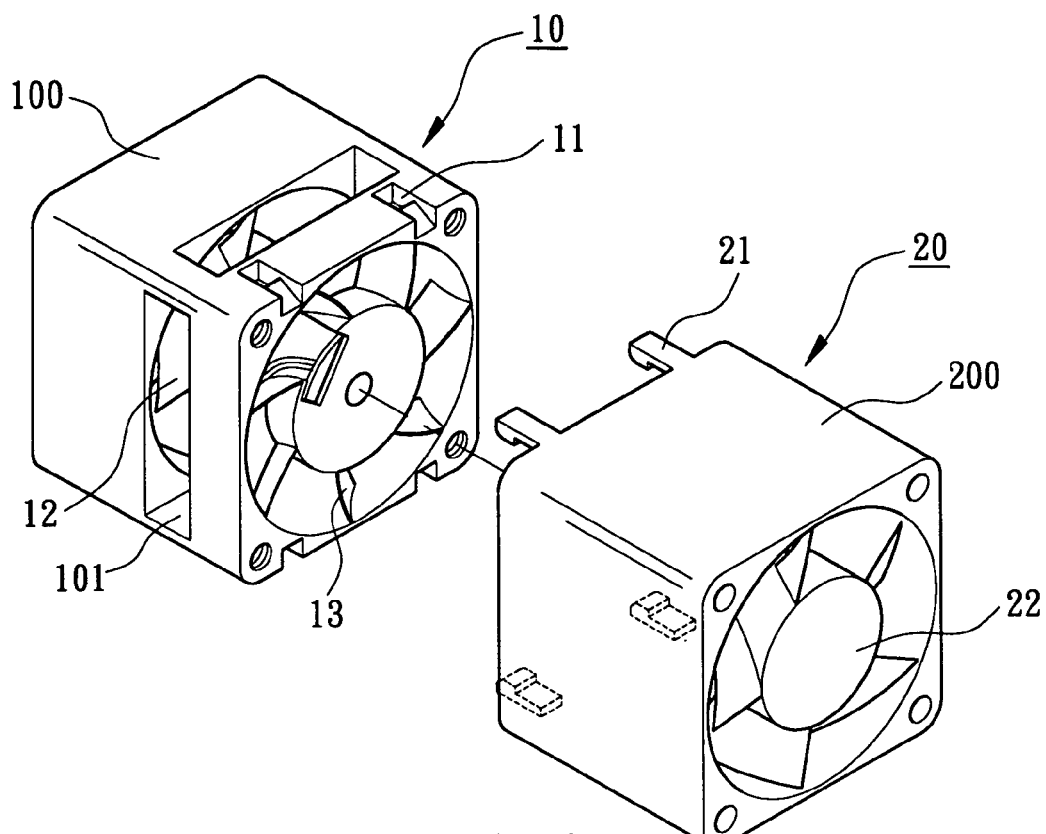
FIG. 3 is an exploded perspective view of a first embodiment of a heat-dissipating module in accordance with the present invention.
Figure 4:
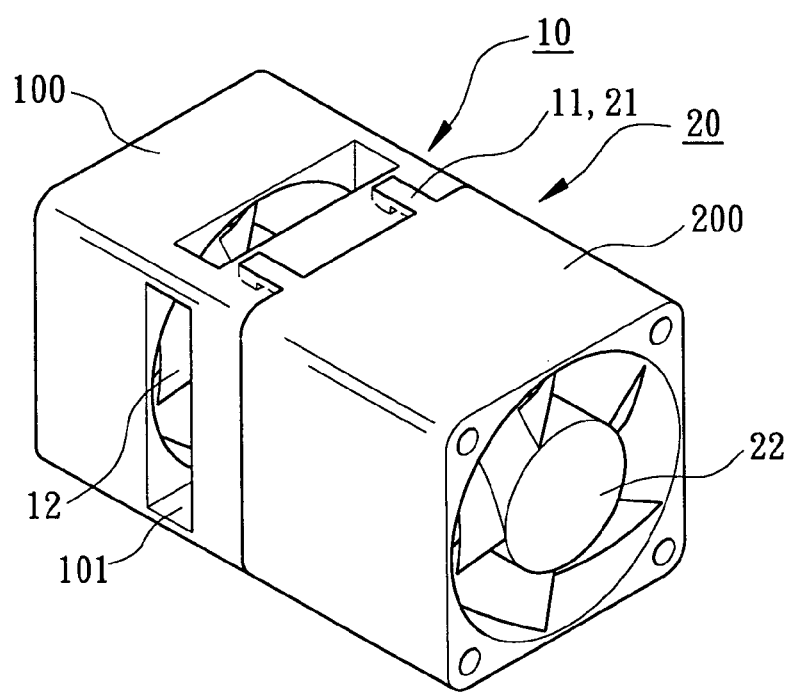
FIG. 4 is a perspective view of the heat-dissipating module in FIG. 3.

Referring to FIGS. 3 and 4, a first embodiment of a heat-dissipating module in accordance with the present invention includes a first fan unit 10, a second fan unit 20, connecting means for connecting first fan unit 10 and the second fan unit 20, and at least one side air inlet 10 1. The first fan unit 10 is located on the air inlet side and includes a casing 100 in which an impeller 12 is received. The second fan unit 20 is located on the air outlet side and includes a casing 200 in which an impeller 22 is received.

In this embodiment, the connecting means includes a plurality of engaging grooves 11 defined in the casing 100 of the first fan unit 10 and a plurality of engaging tabs 21 extending from the casing 200 of the second fan unit 20 for engaging with the engaging groove 11 of the casing 100 of the first fan unit 10, thereby serially connecting the first fan unit 10 and the second fan unit 20.

In this embodiment, there are four side air inlets 101 respectively in the four sides of the casing 100 of the first fan unit 10, and the side air inlets 101 are defined in the side walls of the casing 100 of the first fan unit 10 at a location adjacent to the air outlet side of the casing 100 of the first fan unit 10. Namely, the side air inlets 101 are preferably adjacent to two mutually facing end faces of the first fan unit 10 and the second fan unit 20. Thus, the respective side air inlet 101 is close to the air inlet side of the impeller 22 of the second fan unit 20. The respective side air inlet 101 is preferably rectangular, and the number of the side air inlets 101 can be altered according to need.

Still referring to FIGS. 3 and 4, the side air inlets 101 communicate an air passage (not labeled) in the heat-dissipating module with the outside. Thus, the amount of inlet air and the amount of the outlet air of the second fan unit 20 can be increased through provision of the side air inlets 101 when the first fan unit 10 operates normally. In a case that the first fan unit 10 (or the second fan unit 20) or operates abnormally and thus causes low air-blowing efficiency of the first fan unit 10 (or the second fan unit 20), the impeller 22 of the second fan unit 20 (or the impeller 12 of the first fan unit 10) compensates for the shortage of air supposed to be provided by the first fan unit 10 (or the second fan unit 20) through the side air inlets 101. Also, the air sucked into the heat-dissipating module through the side air inlets 101 compensates for the temporarily existing zone having non-uniform air density distribution resulting from the difference between the amount of air blown by the first fan unit 10 and the amount of air blown by the second fan unit 20.

The heat-dissipating module in accordance with the present invention may include at least one stationary air guide vane 13 for guiding air current and for increasing the wind pressure. The stationary air guide vane 13 may be provided on the air inlet side or the air outlet side of the casing 100 of the first fan unit 10. Alternatively, the stationary air guide vane 13 may be provided on the air inlet side o the air outlet side of the casing 200 of the second fan unit.

Figure 5:
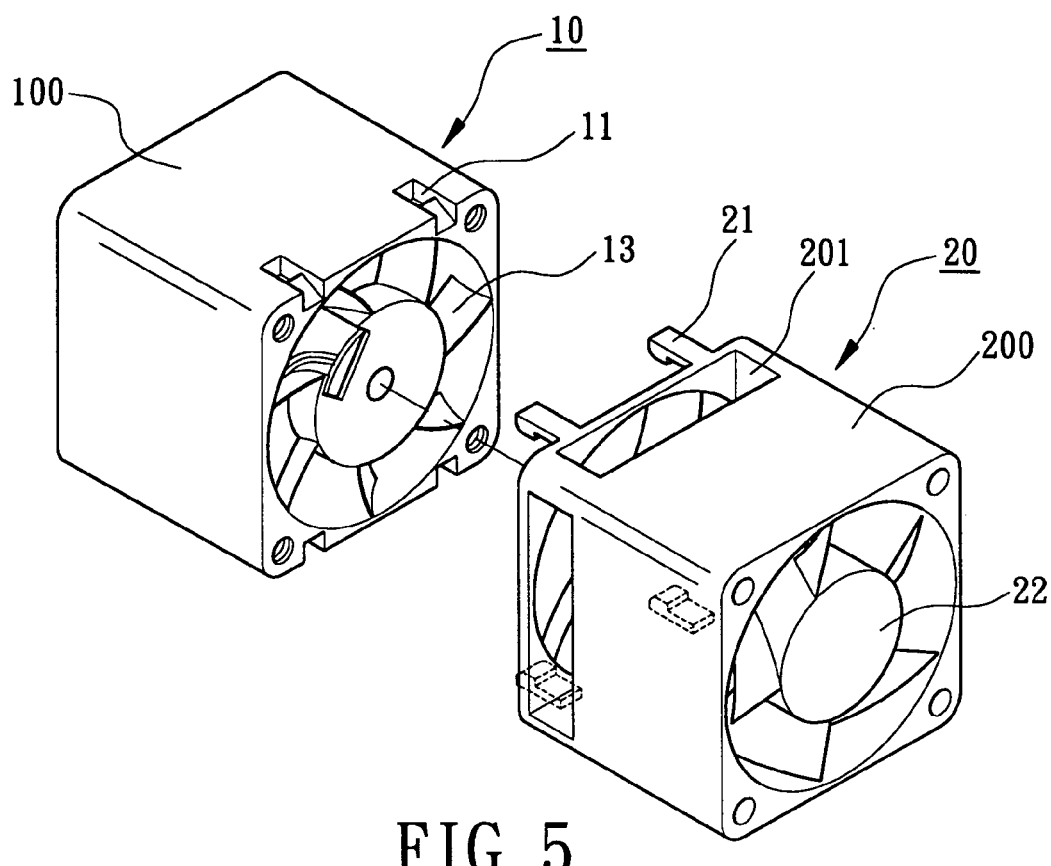
FIG. 5 is an exploded perspective view of a second embodiment of the heat-dissipating module in accordance with the present invention.
Figure 6:
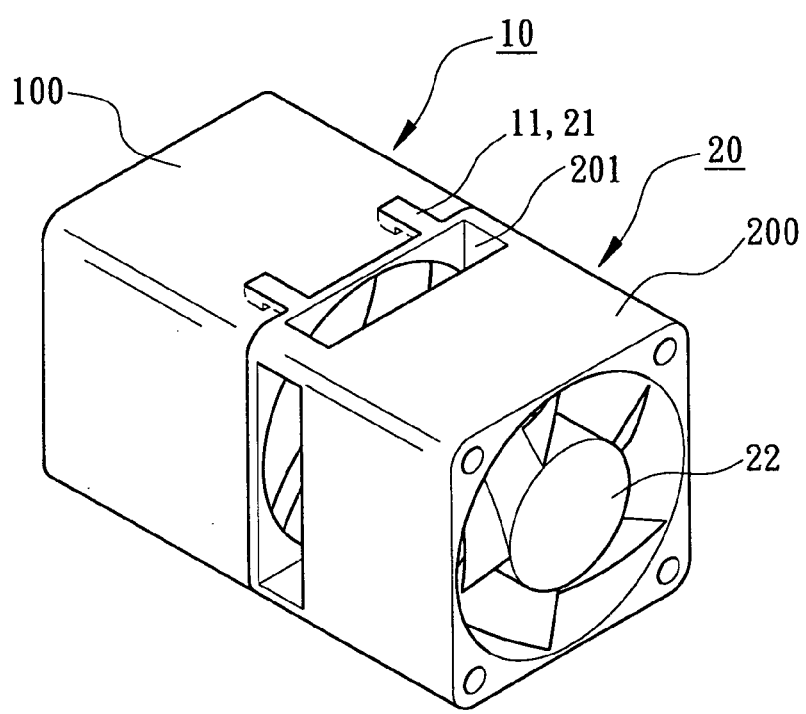
FIG. 6 is a perspective view of the heat-dissipating module in FIG. 5.

FIGS. 5 and 6 illustrate a second embodiment of the heat-dissipating module in accordance with the present invention, wherein at least one side air inlet 201 is defined in at least one of four side walls of the casing 200 of the second fan unit 20. In a preferred embodiment, there are four side air inlets 201 respectively in the four sides of the casing 200 of the second fan unit 20, and the side air inlets 201 are defined in the side walls of the casing 200 of the second fan unit 20 at a location adjacent to the air inlet side of the casing 200 of the second fan unit 20. Namely, the side air inlets 201 are adjacent to two mutually facing end faces of the first fan unit 10 and the second fan unit 20. Thus, the respective side air inlet 201 is close to the air inlet side of the impeller 22 of the second fan unit 20.

Thus, the amount of inlet air and the amount of the outlet air of the second fan unit 20 can be increased through provision of the side air inlets 201 when the first fan unit 10 operates normally. In a case that the first fan unit 10 (or the second fan unit 20) operates abnormally and thus causes low air-blowing efficiency of the first fan unit 10 (or the second fan unit 20), the impeller 22 of the second fan unit 20 (or the impeller 12 of the first fan unit 10) compensates the shortage of air supposed to be provided by the first fan unit 10 (or the second fan unit 20) through the side air inlets 201. Also, the air sucked into the heat-dissipating module through the side air inlets 201 compensates the temporarily existing zone with non-uniform air density distribution resulting from the difference between the amount of air blown by the first fan unit 10 and the amount of air blown by the second fan unit 20.

Figure 7:
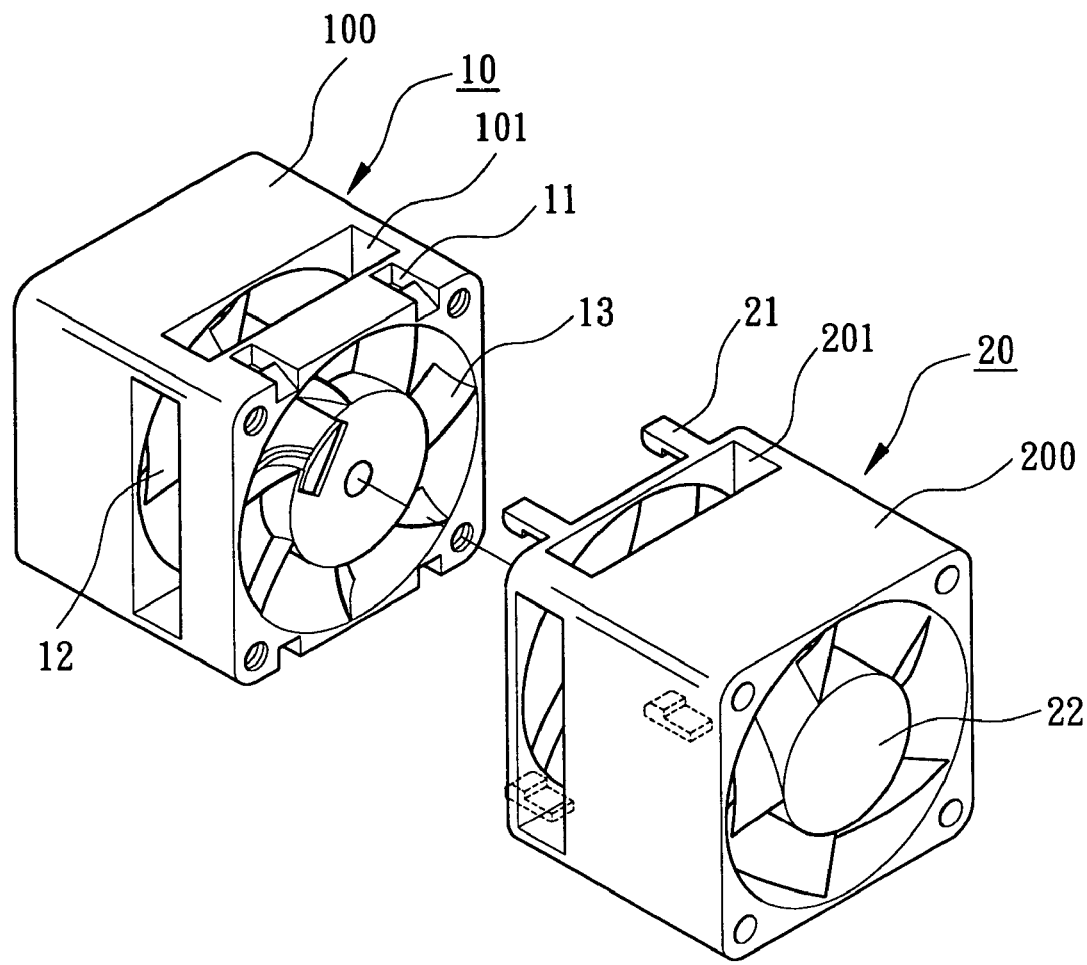
FIG. 7 is an exploded perspective view of a third embodiment of the heat-dissipating module in accordance with the present invention.

FIG. 7 illustrates a third embodiment of the heat-dissipating module in accordance with the present invention, wherein at least one side air inlet 101 is defined in at least one of four side walls of the casing 100 of the first fan unit 10 and at least one side air inlet 201 is defined in at least one of four side walls of the casing 200 of the second fan unit 20. The overall air-introducing area of the side air inlets 101 and 201 is relatively large and thus increases the air inlet amount sucked by the impeller 200 of the second fan unit 20 through the side air inlets 101 and 201. The number of the side air inlets 101 and 201 can be altered according to need.

Figure 8:
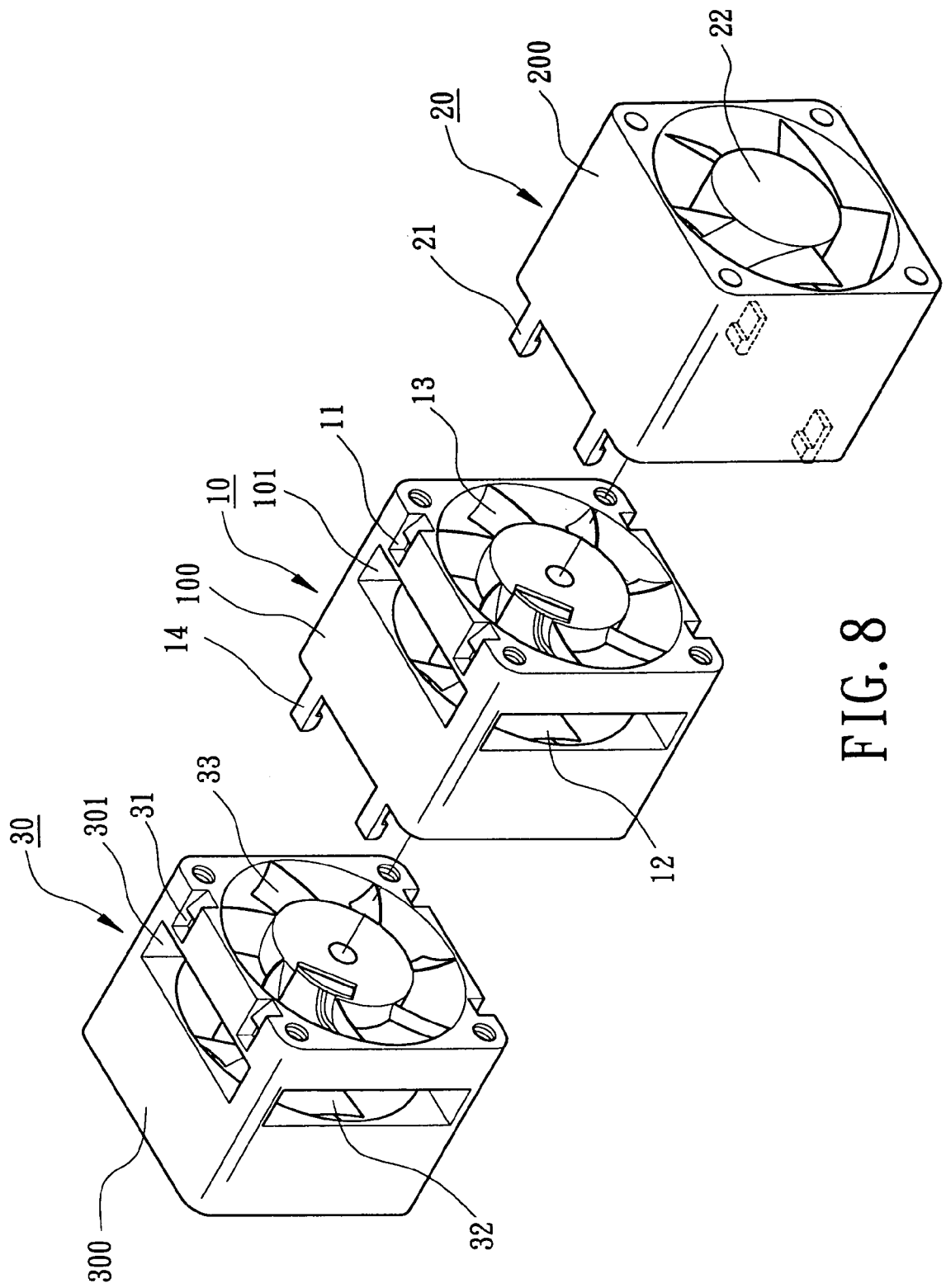
FIG. 8 is an exploded perspective view of a fourth embodiment of the heat-dissipating module in accordance with the present invention.

FIG. 8 illustrates a fourth embodiment of the invention, wherein a third fan unit 30 is serially connected to the first fan unit 10 at the air inlet side of the first fan unit 10. The third fan unit 30 includes a casing 300, a plurality of engaging notches 31, an impeller 32, and at least one side air inlet 301 defined in at least one of four side walls of the casing 300. The first fan unit 10 includes a plurality of engaging tabs 14 for engaging with the engaging notches 31 of the third fan unit 30. However, other suitable connecting means can be used for connecting the first fan unit 10 and the third fan unit 30 together. The side air inlets 301 are defined in the side walls of the casing 300 of the third fan unit 30 at a location adjacent to the air outlet side of the casing 300 of the third fan unit 10. Namely, the side air inlets 301 are adjacent to two mutually facing end faces of the first fan unit 10 and the third fan unit 30. Thus, the heat-dissipating module includes two sets of side air outlets 101 and 301.

The third fan unit 30 improves the overall heat-dissipating efficiency, with the side air outlets 301 of the casing 300 of the third fan unit 30 increasing the air inlet amount and the air outlet amount of the first fan unit 10. Abnormal operation of either one of the first, second, and third fan units 10, 20, and 30 would not adversely affect the air-blowing efficiency of the remaining fan units. The possibility of non-uniform air density distribution between the impellers 12, 22, and 32 is reduced, and the wind noise generated during operation of the heat-dissipating module is lowered. Again, the number of the side air outlets 301 can be altered according to need. The second fan unit 20 may include at least one side air inlet when desired.

Figure 9:
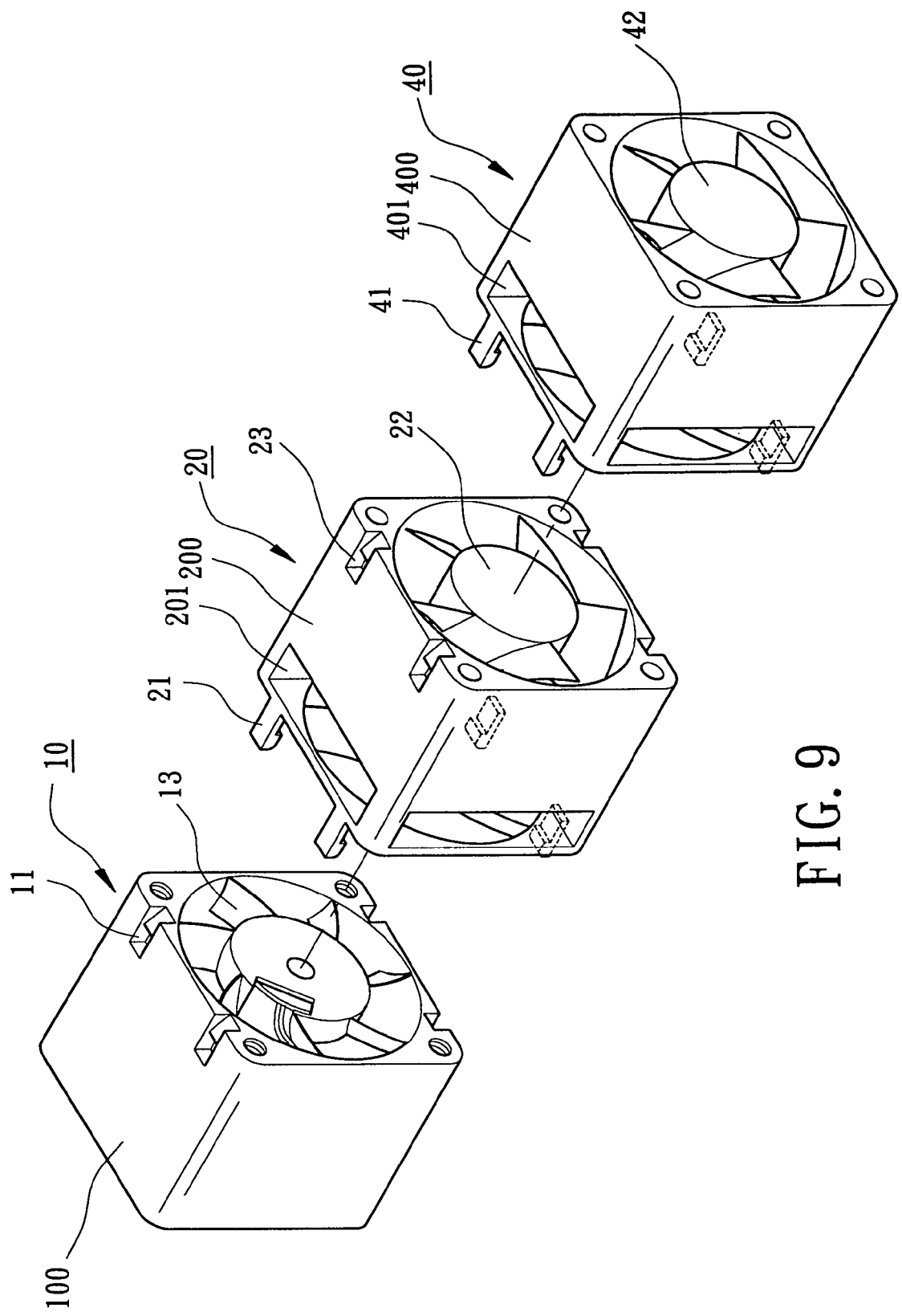
FIG. 9 is an exploded perspective view of a fifth embodiment of the heat-dissipating module in accordance with the present invention.

FIG. 9 illustrates a fifth embodiment of the invention, wherein another fan unit 40 is serially connected to the second fan unit 20 at the air outlet side of the second fan unit 20. The fan unit 40 includes a casing 400, a plurality of engaging tabs 41, an impeller 42, and at least one side air inlet 401 defined in at least one of four side walls of the casing 400. The second fan unit 20 includes a plurality of engaging notches 23 for engaging with the engaging tabs 41 of the fan unit 40. However, other suitable connecting means can be used for connecting the first fan unit 10 and the fan unit 40 together. The side air inlets 401 are defined in the side walls of the casing 400 of the fan unit 40 at a location adjacent to the air inlet side of the casing 400 of the fan unit 40. Namely, the respective side air inlets 401 are adjacent to two mutually facing end faces of the second fan unit 10 and the fan unit 40. Thus, the heat-dissipating module includes two sets of side air outlets 101 and 401.

The fan unit 40 improves the overall heat-dissipating efficiency, with the side air outlets 401 of the casing 400 of the fan unit 40 increasing the air inlet amount and the air outlet amount of the fan unit 40. Abnormal operation of either one of the first, second, and third fan units 10, 20, and 40 would not adversely affect the air-blowing efficiency of the remaining fan units. The possibility of non-uniform air density distribution between the impellers 12, 22, and 42 is reduced, and the wind noise generated during operation of the heat-dissipating module is lowered. Again, the number of the side air outlets 401 can be altered according to need. The first fan unit 10 may include at least one side air inlet when desired.

Figure 10:
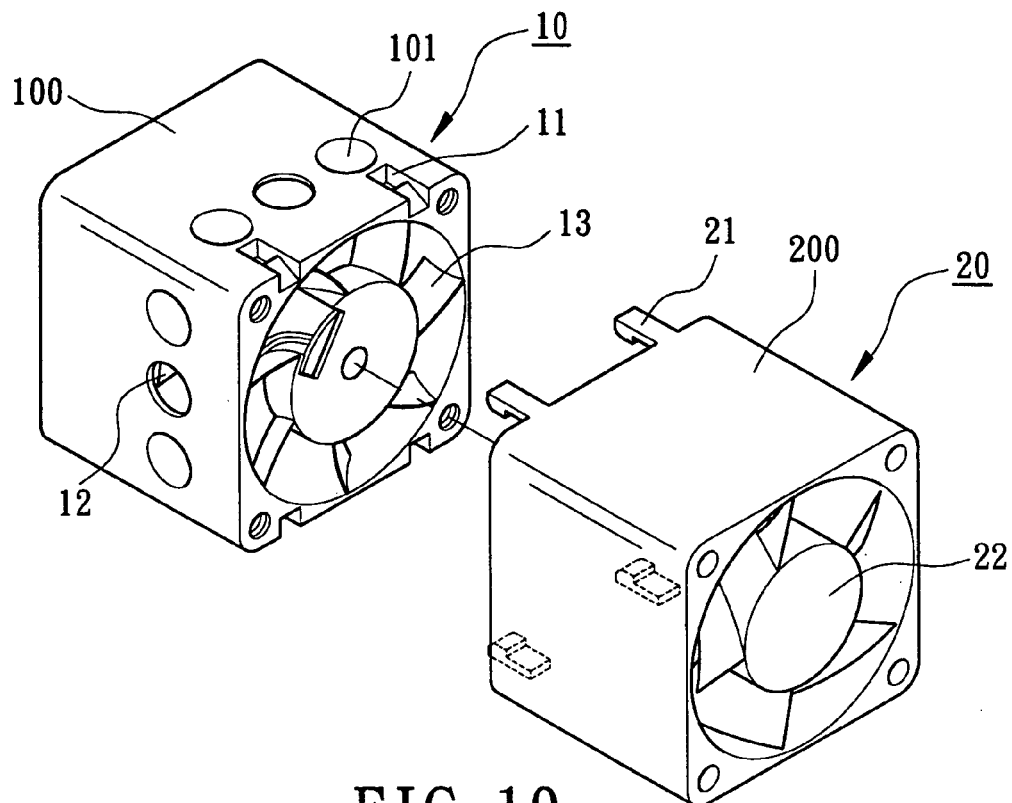
FIG. 10 is an exploded perspective view of a sixth embodiment of the heat-dissipating module in accordance with the present invention.

FIG. 10 illustrates a sixth embodiment of the heat-dissipating module in accordance with the present invention that is modified from the first embodiment, wherein at least one circular side air inlet 101 is defined in at least one of four sides of the first fan unit 10. The structural strength of the first fan unit 10 is improved without adversely affecting the functions of the heat-dissipating module. The second fan unit 20 may include at least one side air inlet when desired.

Figure 11:
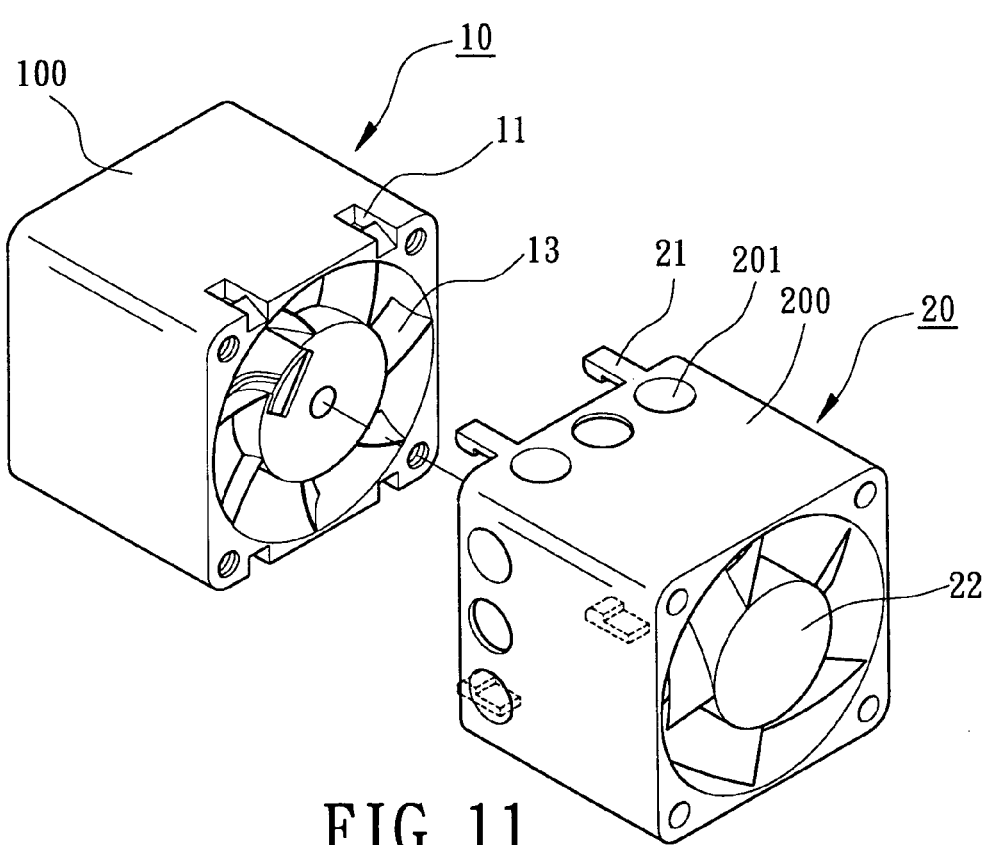
FIG. 11 is an exploded perspective view of a seventh embodiment of the heat-dissipating module in accordance with the present invention.

FIG. 11 illustrates a seventh embodiment of the heat-dissipating module in accordance with the present invention that is modified from the second embodiment, wherein at least one circular side air inlet 201 is defined in at least one of four sides of the second fan unit 20. The structural strength of the second fan unit 20 is improved without adversely affecting the functions of the heat-dissipating module. The first fan unit 10 may include at least one side air inlet when desired.

Figure 12:
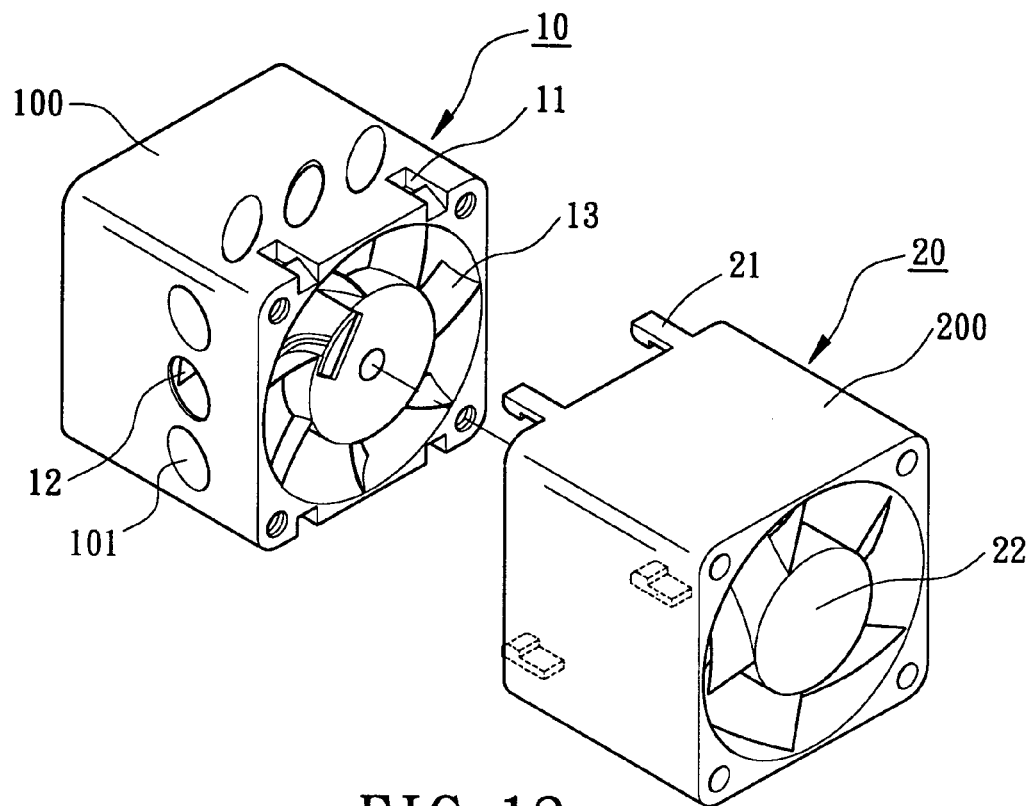
FIG. 12 is an exploded perspective view of an eighth embodiment of the heat-dissipating module in accordance with the present invention.

FIG. 12 illustrates an eighth embodiment of the heat-dissipating module in accordance with the present invention that is modified from the embodiment of FIG. 10, wherein at least one elliptic side air inlet 101 is defined in at least one of four sides of the first fan unit 10. The structural strength of the first fan unit 10 is improved without adversely affecting the functions of the heat-dissipating module. The second fan unit 20 may include at least one side air inlet when desired. Further, similar to the embodiments of FIGS. 8 and 9, additional fan units can be serially connected to the heat-dissipating module when desired.

Figure 13:
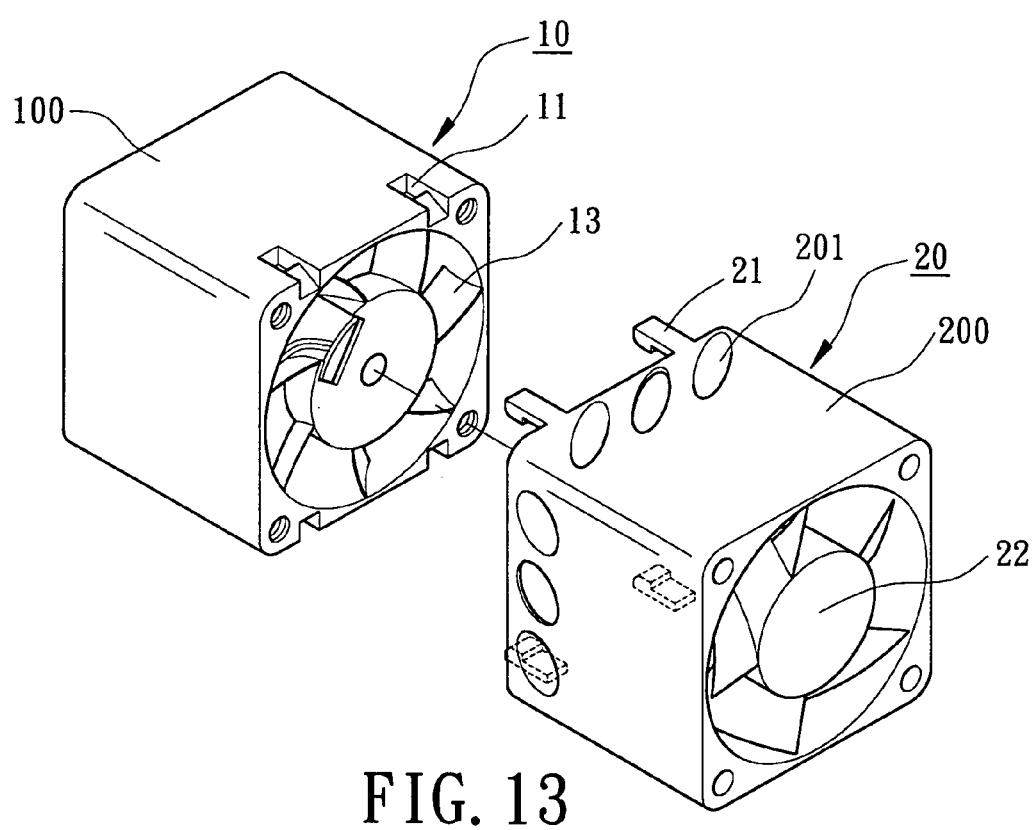
FIG. 13 is an exploded perspective view of a ninth embodiment of the heat-dissipating module in accordance with the present invention.

FIG. 13 illustrates a ninth embodiment of the heat-dissipating module in accordance with the present invention that is modified from the embodiment of FIG. 11, wherein at least one elliptic side air inlet 201 is defined in at least one of four sides of the second fan unit 20. The structural strength of the second fan unit 20 is improved without adversely affecting the functions of the heat-dissipating module. The first fan unit 10 may include at least one side air inlet when desired. Further, similar to the embodiments of FIGS. 8 and 9, additional fan units can be serially connected to the heat-dissipating module when desired.

It is appreciated that the heat-dissipating module in accordance with the present invention may include as many as fan units as desired. The air inlet amount of the heat-dissipating module in accordance with the present invention is increased, and the overall heat-dissipating efficiency is improved. Further, the noise generated during operation of the heat-dissipating module is lowered.

While the principles of this invention have been disclosed in connection with specific embodiments, it should be understood by those skilled in the art that these descriptions are not intended to limit the scope of the invention, and that any modification and variation without departing the spirit of the invention is intended to be covered by the scope of this invention defined only by the appended claims.

What is claimed is:

1. A heat-dissipating module, comprising:
   a first fan unit located on an air inlet side, said first fan unit including a casing having a plurality of side walls and an impeller received in said casing of said first fan unit, said side walls of the first fan unit integrally forming at least one engaging groove; and
   a second fan unit located on an air outlet side, said second fan unit including a casing having a plurality of side walls and an impeller received in said casing of said second fan unit, said side walls of the second fan unit integrally forming at least one engaging lug to engage with said engaging groove;
   said first fan unit and said second fan unit being serially connected by engaging said engaging lug with said engaging groove, at least one side air inlet being integrally formed in at least one of said side walls of said casing of said first fan unit and at least one of said side walls of said casing of said second fan unit for increasing an air inlet amount and an air outlet amount of said second fan unit, said side air inlet being located at a position adjacent to one of said engaging groove of the side walls of the first fan unit and said engaging lug of the side walls of the second fan unit.

2. The heat-dissipating module as claimed in claim 1, wherein said at least one side air inlet is defined in said at least one of said side walls of said casing of said first fan unit at a location adjacent to an air outlet side of said side walls of said casing of said first fan unit.

3. The heat-dissipating module as claimed in claim 1, wherein said at least one side air inlet is defined in said at least one of said side walls of said casing of said second fan unit at a location adjacent to an air inlet side of said side walls of said casing of said second fan unit.

4. The heat-dissipating module as claimed in claim 1, further including at least one additional fan unit serially connected to an air inlet side of said first fan unit.

5. The heat-dissipating module as claimed in claim 4, wherein said at least one additional fan unit includes a casing with a plurality of side walls, at least one additional side air inlet being defined in at least one of said side walls of said casing of said at least one additional fan unit.

6. The heat-dissipating module as claimed in claim 1, further including at least one additional fan unit serially connected to an air outlet side of said second fan unit.

7. The heat-dissipating module as claimed in claim 6, wherein said at least one additional fan unit includes a casing with a plurality of side walls, at least one additional side air inlet being defined in at least one of said side walls of said casing of said at least one additional fan unit.

8. The heat-dissipating module as claimed in claim 1, wherein said at least one side air inlet is one rectangular, circular, and elliptic.

9. The heat-dissipating module as claimed in claim 1, further including at least one stationary air guide vane for guiding air current and increasing wind pressure, said at least one stationary air guide vane being provided on one of an air inlet side and an air outlet side of one of said first fan unit and said second fan unit.

* * * * *